US012633922B2

(12) United States Patent
Costa Beber Vieira et al.

(10) Patent No.: US 12,633,922 B2
(45) Date of Patent: May 19, 2026

(54) LEVEL SHIFTER FOR POWER CONVERTERS

(71) Applicant: Infineon Technologies Austria AG, Villach (AT)

(72) Inventors: Filipe Costa Beber Vieira, Villach (AT); Salvatore Angelo Della Fortuna, San Giovanni la Punta (IT); Oleg Vitrenko, Villach (AT)

(73) Assignee: Infineon Technologies Austria AG, Villach (AT)

( * ) Notice: Subject to any disclaimer, the term of this patent is extended or adjusted under 35 U.S.C. 154(b) by 299 days.

(21) Appl. No.: 18/475,341

(22) Filed: Sep. 27, 2023

(65) Prior Publication Data

US 2025/0105846 A1 Mar. 27, 2025

(51) Int. Cl.
| | |
|---|---|
| *H03K 19/0185* | (2006.01) |
| *H02M 1/08* | (2006.01) |
| *H02M 3/158* | (2006.01) |

(52) U.S. Cl.
CPC ...... *H03K 19/018528* (2013.01); *H02M 1/08* (2013.01); *H02M 3/158* (2013.01)

(58) Field of Classification Search
CPC ... H03K 19/018528; H03K 2217/0081; H03K 19/0175; H02M 1/08; H02M 3/158; H02M 1/0006
See application file for complete search history.

(56) References Cited

U.S. PATENT DOCUMENTS

| | | | |
|---|---|---|---|
| 4,692,641 A | 9/1987 | Highton | |
| 4,945,265 A | 7/1990 | Estrada | |
| 6,211,706 B1 | 4/2001 | Choi et al. | |
| 7,893,730 B2 | 2/2011 | Jung et al. | |
| 8,598,936 B2 | 12/2013 | Kuge | |
| 9,722,610 B2 | 8/2017 | Akahane | |
| 9,979,397 B1 | 5/2018 | Zhu et al. | |
| 10,193,554 B1 | 1/2019 | Sharma et al. | |
| 10,483,977 B1 | 11/2019 | Berwick et al. | |
| 10,536,140 B1 | 1/2020 | Ribarich et al. | |
| 10,749,509 B1 * | 8/2020 | Cascio ........... | H03K 19/018514 |
| 10,868,536 B1 * | 12/2020 | Ke ................. | H03K 19/018514 |
| 11,183,835 B2 | 11/2021 | Lee et al. | |
| 11,606,031 B1 | 3/2023 | Oporta et al. | |
| 11,942,942 B1 | 3/2024 | Chan et al. | |

(Continued)

*Primary Examiner* — Kyle J Moody

(74) *Attorney, Agent, or Firm* — Murphy, Bilak & Homiller, PLLC

(57) ABSTRACT

A level shifter for a power converter includes: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a fixed DC voltage, and a source; a first circuit configured to dynamically control a voltage applied to the source of the first transistor based on a digital signal input to the level shifter; and a second circuit configured to dynamically control a voltage applied to the source of the second transistor based on the digital signal. The differential detector is configured to translate the digital signal to a different voltage level based on a differential current between the first transistor and the second transistor.

19 Claims, 8 Drawing Sheets

(56)　　　　　　References Cited

U.S. PATENT DOCUMENTS

| | | | |
|---|---|---|---|
| 12,362,752 B2 | 7/2025 | Lam | |
| 2002/0105311 A1* | 8/2002 | Rutter | H02M 1/08 |
| | | | 323/283 |
| 2005/0122754 A1 | 6/2005 | Nielsen | |
| 2012/0229165 A1 | 9/2012 | Tseng et al. | |
| 2014/0152369 A1 | 6/2014 | Qi | |
| 2016/0277008 A1 | 9/2016 | Green et al. | |
| 2017/0110971 A1 | 4/2017 | Degen et al. | |
| 2018/0034466 A1 | 2/2018 | Zhang et al. | |
| 2018/0302072 A1 | 10/2018 | Abesingha et al. | |
| 2019/0140635 A1 | 5/2019 | Abesingha et al. | |
| 2020/0018782 A1 | 1/2020 | Gupta et al. | |
| 2020/0044648 A1 | 2/2020 | Sharma et al. | |
| 2020/0162074 A1 | 5/2020 | Niikura | |
| 2020/0382122 A1 | 12/2020 | Niikura | |
| 2021/0218389 A1 | 7/2021 | Rajalakshmi et al. | |
| 2021/0351686 A1 | 11/2021 | Bognanni et al. | |
| 2022/0103162 A1 | 3/2022 | Shuvalov | |
| 2022/0302839 A1 | 9/2022 | Ishino | |
| 2024/0106318 A1 | 3/2024 | Kwak et al. | |
| 2025/0175179 A1 | 5/2025 | Hsu et al. | |
| 2025/0211231 A1 | 6/2025 | Lin | |

* cited by examiner

LEVEL SHIFTER FOR POWER CONVERTERS

BACKGROUND

Power converters such as half and full bridge converters typically use a bootstrap technique which includes a bootstrap capacitor to create a floating voltage domain to drive one or more high-side power switches of the power converter. In a typical application of a DC-DC buck converter, in the time interval between when the high-side power switch is active and the low-side power switch is active, there is dead time when all of the power switches are off. During the dead time, the output inductor forces a current to flow, and as a consequence, the switching node of the power converter is forced to a negative value. If silicon transistors are used to implement the power switches, the low-side power switch has a parasitic/body diode in place, and the negative voltage at the switching node is around −0.7V. If a GaN transistor(s) is used to implement the low-side power switch, low-side power switch does not have a body diode but can conduct current if the voltage between the drain and gate creates a channel. In this case, the switching node of the power converter is forced to a more negative voltage such as in a range of −2V to −5V. Due to the existence of the bootstrap capacitor, the bootstrap node, which is the positive supply voltage of the high side driver, follows the switching node of the power converter, falling to a level close to ground. To leave the dead time mode, the input control of high side driver toggles, sending a signal from the low-voltage input domain to the high side domain through a level shifter, and finally toggling the driver for the high-side power switch. Since the switching node of the power converter and the low-voltage input domain are both close to 0V in this case, there is not enough headroom voltage for the level shifter to propagate the current signal.

Thus, there is a need for a level shifter design with improved voltage headroom for power converter applications.

SUMMARY

According to an embodiment of a level shifter, the level shifter comprises: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first circuit configured to dynamically control a voltage applied to the source of the first transistor based on a digital signal input to the level shifter; and a second circuit configured to dynamically control a voltage applied to the source of the second transistor based on the digital signal, wherein the differential detector is configured to translate the digital signal to a different voltage level based on a differential current between the first transistor and the second transistor.

According to another embodiment of a level shifter, the level shifter comprises: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first capacitor having a first terminal and second terminal, the second terminal being electrically connected to the source of the first transistor; a first switch device electrically connected between a first DC supply voltage or ground reference and the first terminal of the first capacitor; a second switch device electrically connected between the first terminal of the first capacitor and ground or a bootstrap node; a third switch device electrically connected between the second terminal of the first capacitor and ground or the bootstrap node; a second capacitor having a first terminal and second terminal, the second terminal being electrically connected to the source of the second transistor; a fourth switch device electrically connected between a second DC supply voltage or ground reference and the first terminal of the second capacitor; a fifth switch device electrically connected between the first terminal of the second capacitor and ground or the bootstrap node; and a sixth switch device electrically connected between the second terminal of the second capacitor and ground or the bootstrap node.

According to an embodiment of a power converter, the power converter comprises: a high-side power switch device; a gate driver configured to drive a gate of the high-side power switch device; and a level shifter configured to translate a digital signal input to the level shifter to a voltage domain of the gate driver, wherein the level shifter comprises: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first circuit configured to dynamically control a voltage applied to the source of the first transistor based on the digital signal; and a second circuit configured to dynamically control a voltage applied to the source of the second transistor based on the digital signal, wherein the differential detector is configured to translate the digital signal to the voltage domain of the gate driver based on a differential current between the first transistor and the second transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a level shifter having improved voltage headroom. The level shifter may be used in power converter applications such as half and full bridge converters. The level shifter uses high-voltage transistors and a differential circuit for sending digital information from a low-side domain to a high-side domain. The high-voltage transistors are controlled at their source terminals and not at their gate terminals. The gate terminals of the high-voltage transistors are connected to ground or to a DC voltage, e.g., close to ground, while the source terminals are switched in a complementary manner which reflects the low or high level of the input digital signal. For example, flying capacitors may be used to switch the source terminals of the high-voltage transistors. In a first phase, the corresponding flying capacitor is pre-charged with a DC voltage, with the same voltage as the maximum gate-to-source voltage of the high-voltage transistor coupled to the flying capacitor. When the input of the level shifter toggles, the flying capacitor is connected to the source terminal of the high-voltage transistor, providing a negative voltage to the source terminal. The current created by this high-voltage transistor is detected by the high side circuitry, and the digital signal can be reconstructed. The other flying capacitor and high-voltage transistor operate in a complimentary manner to implement the differential circuit.

Described next, with reference to the figures, are exemplary embodiments of the level shifter and power converters that use the level shifter.

Figure 1:
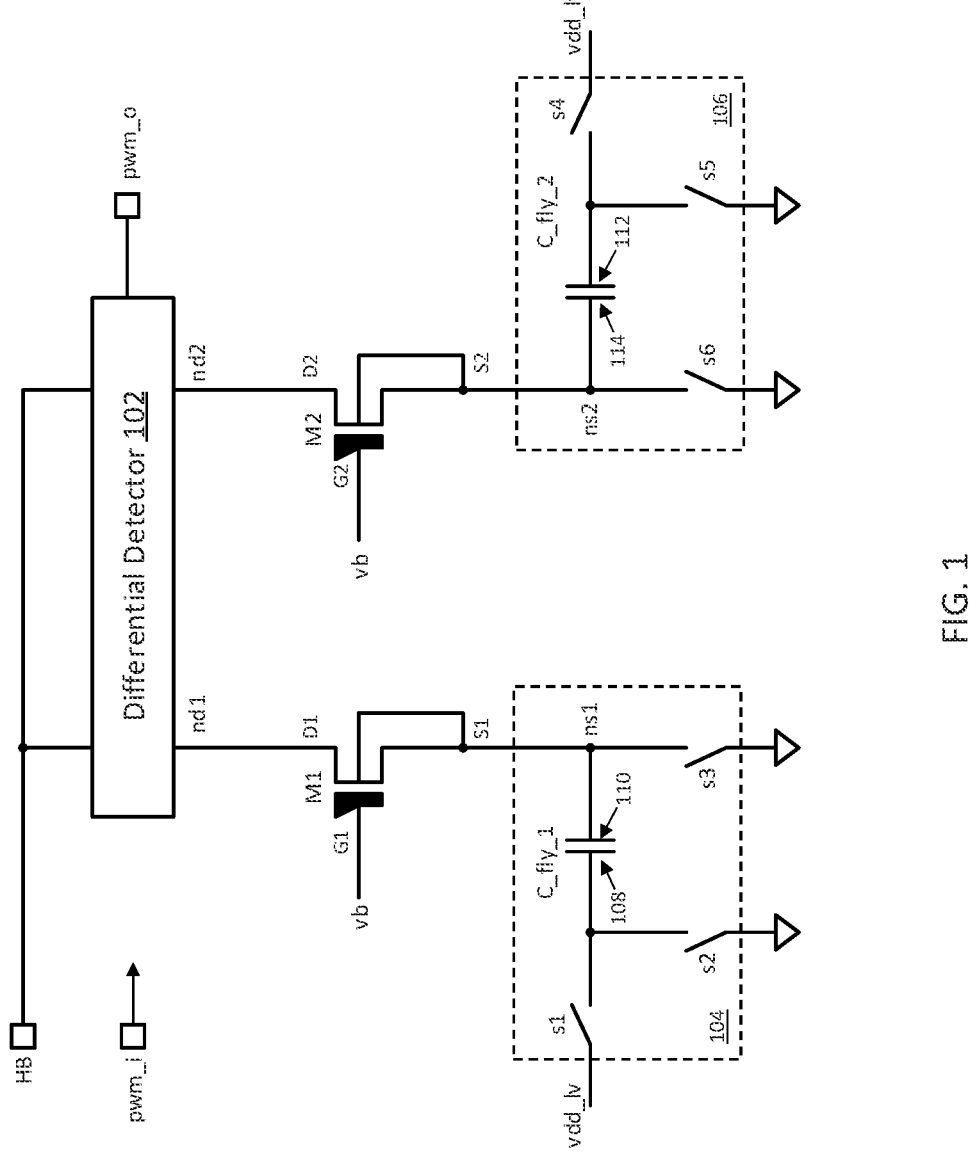
FIG. 1 illustrates a circuit schematic of a level-up shifter, according to an embodiment.

FIG. 1 illustrates a circuit schematic of a level shifter 100, according to an embodiment. The level shifter 100 includes a differential detector 102, a first transistor M1 having a drain D1 electrically connected to a first node nd1 of the differential detector 102, and a second transistor M2 having a drain D2 electrically connected to a second node nd2 of the differential detector 102. The gate G1 of the first transistor M1 is electrically connected to ground or a fixed DC voltage vb. The gate G2 of the second transistor M2 also is electrically connected to ground or a fixed DC voltage vb. The fixed DC voltage vb may be the same or different for the first and second transistors M1, M2.

The level shifter 100 also includes a first circuit 104 that dynamically controls a voltage applied to the source S1 of the first transistor M1 based on a digital signal pwm_i input to the level shifter 100. A second circuit 106 of the level shifter 100 dynamically controls a voltage applied to the source S2 of the second transistor M2 based on the digital signal pwm_i input to the level shifter 100. The differential detector 102 translates the digital signal pwm_i to a different voltage level pwm_o based on a differential current between the first transistor M1 and the second transistor M2. The first and second transistors M1, M2 have short pull down current pulses. The differential detector 102 detects the difference and generates a pulse which is latched so that pulse remains active until the next cycle. This allows for quick turn off of transistor M1 (or M2), reducing power losses and relaxing reliability requirements for these transistors.

In FIG. 1, the first circuit 104 includes a first flying capacitor C_fly_1 and a first switch network s1-s3. In response to a first transition (low-to-high or high-to-low) in the digital signal pwm_i input to the level shifter 100, the first switch network s1-s3 connects the first flying capacitor C_fly_1 to the source S1 of the first transistor M1 such that a negative voltage is applied to the source S1 of the first transistor M1. After the rising or enabling transition in the digital signal pwm_i input to the level shifter 100, the first switch network s1-s3 pre-charges the first flying capacitor C_fly_1 for a next first transition in the digital signal pwm_i.

In FIG. 1, the second circuit 106 includes a second flying capacitor C_fly_2 and a second switch network s4-s6. In response to a falling or disabling transition in the digital signal pwm_i input to the level shifter 100 opposite the first transition, the second switch network s4-s6 connects the second flying capacitor C_fly_2 to the source S2 of the second transistor M2 such that a negative voltage is applied to the source S2 of the second transistor M2. After the second transition in the digital signal pwm_i input to the level shifter 100, the second switch network s4-s6 pre-charges the second flying capacitor C_fly_2 for a next second transition in the digital signal.

In FIG. 1, the first switch network s1-s3 includes a first switch device s1, a second switch device s2, and a third switch device s3. The first switch device s1 is electrically connected between a first DC supply voltage vdd_lv and a first terminal 108 of the first flying capacitor C_fly_1. The second switch device s2 is electrically connected between the first terminal 108 of the first flying capacitor C_fly_1 and ground. The third switch device s3 is electrically connected between a second terminal 110 of the first flying capacitor C_fly_1 and ground, with the second terminal 110 of the first flying capacitor C_fly_1 also being electrically connected to the source S1 of the first transistor M1. The second switch device s2 turns on in response to the first transition in the digital signal pwm_i input to the level shifter 100. The first switch device s1 and the third switch device s3 are both off when the second switch device s2 is on. The second switch device s2 turns off after a predefined time from the first transition in the digital signal pwm_i input to the level shifter 100. The first switch device s1 and the third switch device s3 are both on when the second switch device s2 is off.

In FIG. 1, the second switch network s4-s6 includes a fourth switch device s4, a fifth switch device s5, and a sixth switch device s6. The fourth switch device s4 is electrically connected between a second DC supply voltage vdd_lv and a first terminal 112 of the second flying capacitor C_fly_2. The fifth switch device s5 is electrically connected between the first terminal 112 of the second flying capacitor C_fly_2 and ground. The sixth switch device s6 is electrically connected between a second terminal 114 of the second flying capacitor C_fly_2 and ground, with the second terminal 114 of the second flying capacitor C_fly_2 also being electrically connected to the source S2 of the second transistor M2. The fifth switch device s5 turns on in response to the second transition in the digital signal pwm_i input to the level shifter 100. The fourth switch device s4 and the sixth switch device s6 are both off when the fifth switch device s5 is on. The fifth switch device s5 turns off after a predefined time from the second transition in the digital signal pwm_i input to the level shifter 100. The fourth switch device s4 and the sixth switch device s6 are both on when the fifth switch device s5 is off.

In FIG. 1, the level shifter 100 is an up-level shifter meaning that the level shifter 100 translates the digital signal pwm_i input to the level sifter 100 to a higher voltage level. In the up level shifter case, the differential detector 102 is coupled between a bootstrap node HB and the first and the second transistors M1, M2, the first and the second transistors M1, M2 are NMOS (n-channel metal-oxide-semiconductor) devices coupled between the differential detector 102 and ground, and the differential detector 102 translates the digital signal pwm_i input to the level sifter 100 to a higher voltage level based on the differential current between the first transistor M1 and the second transistor M2.

The level shifter 100 in FIG. 1 is differential, with the operation of the left and right sides being complementary to one another. The switch devices s1, s2, s3 of the first switch network s1-s3 are used to control node ns1, which controls the current of the first transistor M1 and the left side of the level shifter 100. The switch devices s4, s5, s6 of the second switch network s4-s6 are used to control node ns2, which controls the current of the second transistor M2 and the right side of the level shifter 100.

In a non-switching state condition, the third and sixth switch devices s3 and s6 are on, assuring the potentials at nodes ns1 and ns2 are connected to the GND, and the transistors M1 and M2 are off. During this state, the first and fourth switch devices s1 and s4 are also on, charging the flying capacitors C_fly_1 and C_fly_2 with the voltage difference of vdd_lv to GND. To enable charging of the flying capacitors C_fly_1 and C_fly_2, the second and fifth switch devices s2 and s5 are kept off. Since transistors M1 and M2 are both off in this state, the differential detector 102 is latched to the last state level.

For latching the differential detector 102 to one position, the left side of the level shifter 100 is used. In this case, the first and third switch devices s1 and s3 are turned off and the second switch device s2 is turned on, connecting the first terminal 108 of the first flying capacitor C_fly_1 to ground and forcing a negative voltage to node ns1. Since the gate G1 of the first transistor M1 is connected to ground or close to ground potential, there is a voltage difference between the gate-to-source voltage (VGS) and the drain-to-source voltage (VDS) of the first transistor M1, which draws current into the first (left) node nd1 of the differential detector 102. The differential detector 102 detects that current is flowing in the left side (from transistor M1) and no current is flowing in the right side (from transistor M2), and in response toggles the output pwm_o of the level shifter 100 from low to high (or high to low). The current flowing in M1 is provided by the first flying capacitor C_fly_1, which, e.g., may be turned on for just a few nanoseconds (turn-on time needs to be slightly higher than the propagation delay of the level shifter). The size of the flying capacitors C_fly_1, C_fly_2 should be designed to ensure a small discharge during the time the respective high voltage transistors M1, M2 are on. After a predefined time, the switches devices s1, s2, s3 of the first switch network s1-s3 return to their default states. As there is no difference in current between the first and second transistors M1 and M2, the output of the differential detector 102 is latched.

For latching the differential detector 102 to the opposite position, the right side of the level shifter 100 is used. In this case, the fourth and sixth switch devices s4 and s6 are turned off and the fifth switch device s5 is turned on, connecting the first terminal 112 of the second flying capacitor C_fly_2 to ground and forcing a negative voltage to node ns2. Since the gate G2 of the second transistor M2 is connected to ground or close to ground potential, there is a voltage difference between the VGS and the VDS of the second transistor M2, which draws current into the second (right) node nd2 of the differential detector 102. The differential detector 102 detects that current is flowing in the right side (from transistor M2) and no current is flowing in the left side (from transistor M1), and in response toggles the output pwm_o of the level shifter from high to low (or low to high). After a predefined time, the switch devices s4, s5, s6 of the second switch network s4-s6 returns to their default states. As there is no difference in current between the first and second transistors M1 and M2, the output pwm_o of the differential detector 102 is latched.

Figure 2:
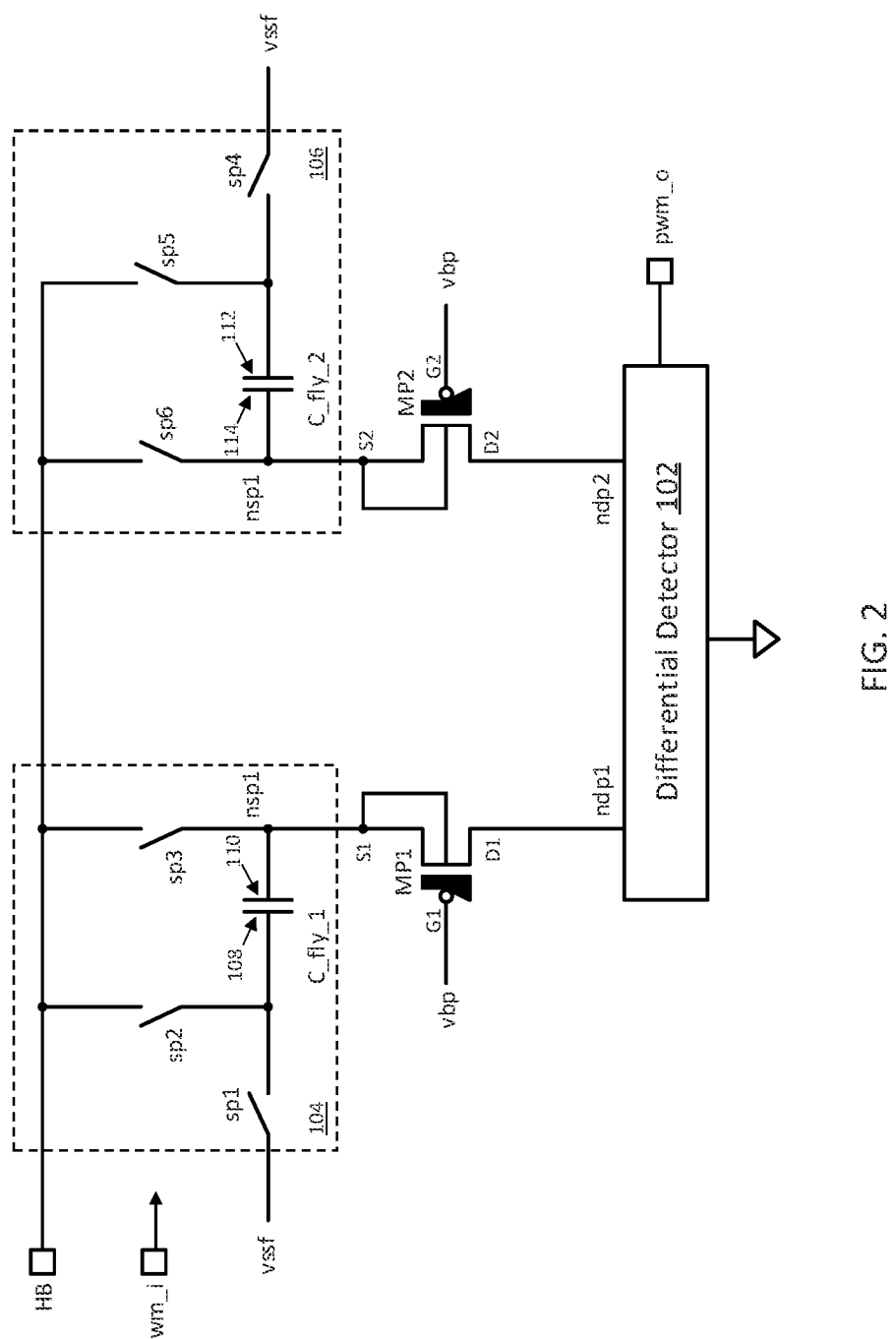
FIG. 2 illustrates a circuit schematic of a level-down shifter, according to another embodiment.

FIG. 2 illustrates a circuit schematic of a level shifter 200, according to another embodiment. The level shifter 200 in FIG. 2 is similar to the level shifter 100 in FIG. 1. In FIG. 2, the level shifter 200 is a down level shifter meaning that the level shifter 200 translates the digital signal pwm_i input to the level sifter 200 to a lower voltage level. In the down level shifter case, the differential detector 102 is coupled between ground and the first and the second transistors M1, M2, the first and the second transistors M1, M2 are PMOS (p-channel metal-oxide-semiconductor) devices coupled between the differential detector 102 and the bootstrap node HB, the switch devices s1-s6 of the first and second circuits are also PMOS devices, and the differential detector 102 translates the digital signal pwm_i input to the level sifter 200 to a lower voltage level based on the differential current between the first transistor M1 and the second transistor M2. The PMOS device types are indicated by the inclusion of the letter 'P'/'p' in the transistor and node labels.

In FIG. 2, the first switch device sp1 of the first switch network sp1-sp3 is electrically connected between a first ground reference vssf and the first terminal 108 of the first flying capacitor C_fly_1. The second switch device sp2 of the first switch network sp1-sp3 is electrically connected between the first terminal 108 of the first flying capacitor C_fly_1 and the bootstrap node HB. The third switch device sp3 of the first switch network sp1-sp3 is electrically connected between the second terminal 110 of the first flying capacitor C_fly_1 and the bootstrap node HB. The fourth switch device sp4 of the second switch network sp4-sp6 is electrically connected between a second ground reference vssf and the first terminal 112 of the second flying capacitor C_fly_2. The fifth switch device sp5 of the second switch network sp4-sp6 is electrically connected between the first terminal 112 of the second flying capacitor C_fly_2 and the bootstrap node HB. The sixth switch device sp6 of the second switch network sp4-sp6 is electrically connected between the second terminal 114 of the second flying capacitor C_fly_2 and the bootstrap node HB.

Figure 3:
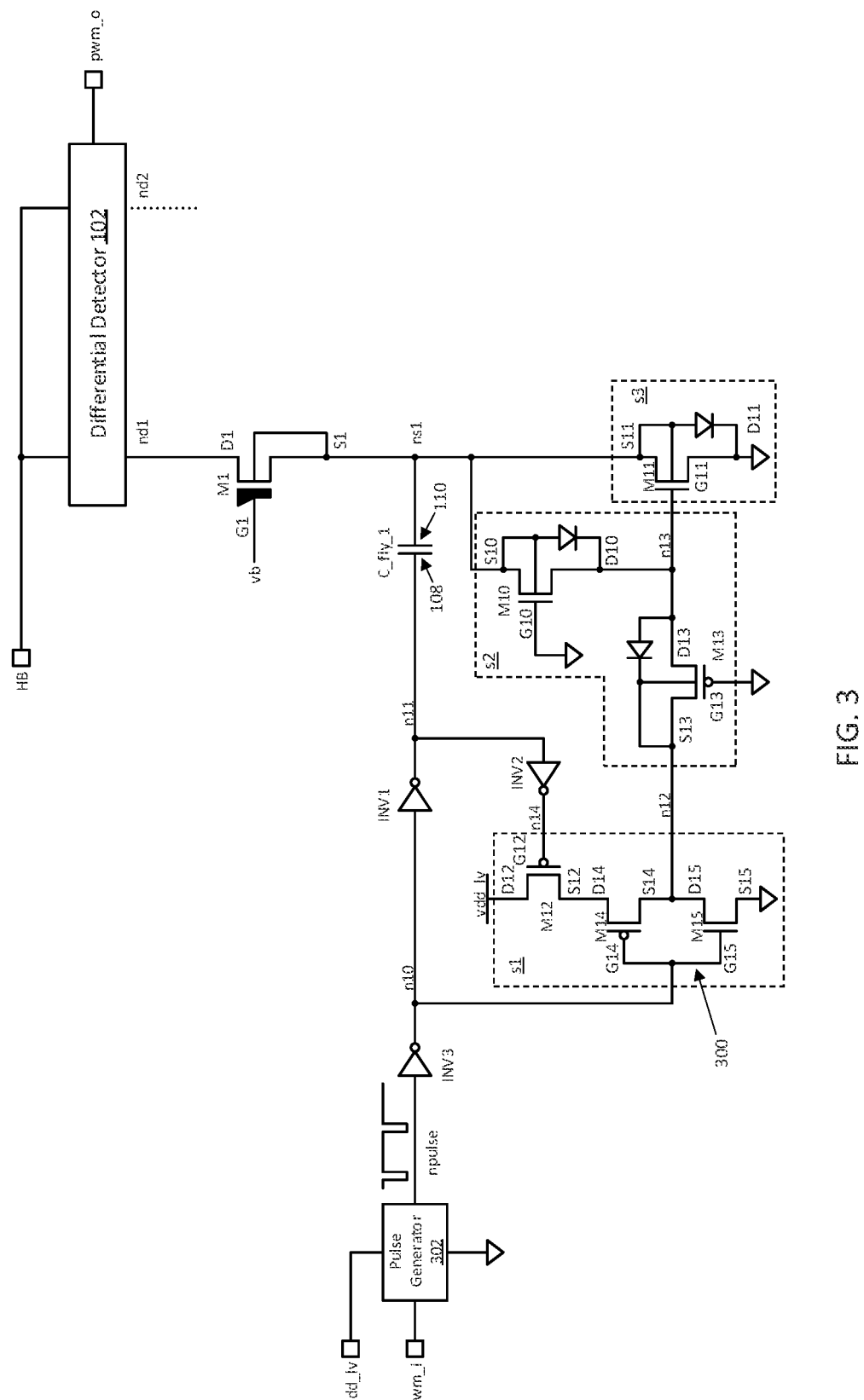
FIG. 3 illustrates a circuit schematic of a first switch network included in the level-up shifter, according to an embodiment.

FIG. 3 illustrates an embodiment of the first switch network s1-s3 for the up-level shifter embodiment. In FIG. 3, the first switch device s1 includes a first PMOS transistor M12 having a positive pulse gate input G12 via inverter INV2 electrically connected to the first terminal 108 of the first flying capacitor C_fly_1, a drain D12 electrically connected to the first DC supply voltage vdd_lv, and a source S12. The first switch device s1 in FIG. 3 also includes a first inverter 300 formed by a second PMOS transistor M14 and a first NMOS transistor M15. The first inverter 300 has a positive pulse input via inverter INV3 which is applied to the gate G14 of the second PMOS transistor M14 and to the gate G15 of the first NMOS transistor M15. The drain D14 of the second PMOS transistor M14 is electrically coupled to the source S12 of the first PMOS transistor M12. The source S15 of the first NMOS transistor M15 is grounded.

The second switch device s2 in FIG. 3 includes a second NMOS transistor M10 having a grounded gate input G10, a source S10 electrically connected to the source S1 of the first transistor M1 and the second terminal 110 of the first flying capacitor C_fly_1, and a drain D10. The second switch device s2 in FIG. 3 also includes a third PMOS transistor M13 having a grounded gate input G13, a source S13 electrically connected to the output of the first inverter 300, and a drain D13 electrically connected to the drain D10 of the second NMOS transistor M10.

The third switch device s3 in FIG. 3 includes a third NMOS transistor M11 having a gate G11 electrically connected to the drain D13 of the third PMOS transistor P13 and the drain D10 of the second NMOS transistor M10, a source S11 electrically connected to the source S1 of the first transistor M1, and a drain D11 electrically connected to ground.

The second switch network s4-s6 and the first switch network s1-s3 are symmetric for the up-level shifter, as shown in FIG. 1. Accordingly, details of the second switch network s4-s6 are not shown in FIG. 3. Similar to the first switch device s1, the fourth switch device s4 includes: a fourth PMOS transistor having a positive pulse gate input electrically connected to the first terminal 112 of the second flying capacitor C_fly_2, a drain electrically connected to the second DC supply voltage vdd_lv, and a source; and a second inverter formed by a fifth PMOS transistor and a fourth NMOS transistor, the second inverter having a positive pulse input, a drain of the fifth PMOS transistor being electrically coupled to the source of the second PMOS transistor, a source of the fourth NMOS transistor being grounded. Similar to the second switch device s2, the fifth switch device s5 includes: a fifth NMOS transistor having a grounded gate input, a source electrically connected to the source S2 of the second transistor M2 and the second terminal 114 of the second flying capacitor C_fly_2, and a drain; and a sixth PMOS transistor having a grounded gate input, a source electrically connected to the output of the second inverter, and a drain electrically connected to the drain of the fifth NMOS transistor. Similar to the third switch device s3, the sixth switch device s6 includes a sixth NMOS transistor having a gate electrically connected to the drain of the sixth PMOS transistor and the drain of the fifth NMOS transistor, a source electrically connected to the source S2 of the second transistor M2, and a drain electrically connected to ground.

Figure 4:
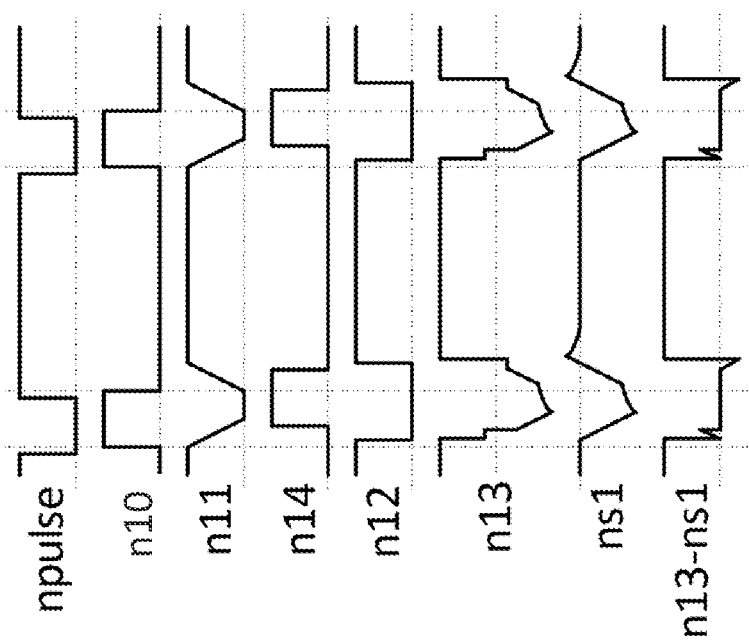
FIG. 4 illustrates various waveforms associated with the operation of the level-up shifter of FIG. 3.

FIG. 4 illustrates various waveforms associated with the operation of the up level shifter implementation shown in FIG. 3. A pulse generator 302 generates a negative pulse output 'npulse' based on the digital signal pwm_i input to the level shifter 100. In steady state, the negative pulse output npulse of the pulse generator 302 is fixed at a logic 1 level and node n11 is at the DC supply voltage vdd_lv to charge the first flying capacitor C_fly_1. Ground is provided to node ns1 by the third NMOS transistor M11 of the third switch device s3. The gate G11 of the third NMOS transistor M11 is coupled to node n13 which is at the DC supply voltage vdd_lv delivered through the third PMOS transistor M13 of the second switch device s2 from node n12. The potential of node n12 is defined by the potential of node n10 and node n11 sensed by inverter INV2 which controls node n14.

When a negative edge appears at the pulse output npulse of the pulse generator 302, node n10 moves up which causes node n12 to move immediately down and thus also move node n13 down to around a threshold voltage Vt above ground (until transistor M13 allows it). This causes the third NMOS transistor M11 of the third switch device s3 to be nearly switched OFF. At this moment, node n13 became high ohmic and node ns1 becomes undriven and defined only by the charge state of the first flying capacitor C_fly_1 in relation to node n11. Switching transistor M11 OFF before the movement of ns1 node prevents the first flying capacitor C_fly_1 from unwanted discharging by transistor M11 during movement of node ns1 below ground potential.

The moving of node n10 up also causes node n11 to move slowly down because of engaging current on the first cross-domain transistor M1. The first flying capacitor C_fly_1 forces the node ns1 to follow the movement of node n11, but node ns1 moves down from ground potential to a negative value. As soon as node ns1 reaches a threshold voltage Vt below the ground, the second NMOS transistor M10 of the second switch device s2 starts to conduct and connects together nodes ns1 and n13, forcing the third NMOS transistor M11 of the third switch device s3 to remain OFF during the whole transition.

In this state, the first flying capacitor C_fly_1 delivers charge to the source S1 of the first cross-domain transistor M1 from node n11 which is kept at ground potential by inverter INV1. Charge on the first flying capacitor C_fly_1 decays, causing node ns1 to slowly move up toward ground potential. The charge delivered by the first flying capacitor C_fly_1 is sufficient to be detected on the bootstrap node HB domain. The bootstrap node HB domain is provided enough time to reliably detect the pulse while at the same time the pulse width is reduced as much as possible to reduce power consumption.

When the digital signal pwm_i input to the level shifter 100 begins a rising edge, the pulse output npulse of the pulse generator 302 finishes the negative pulse. Node n10 then moves down, causing node n11 to begin moving up. Node ns1 follows node n11 up while the third NMOS transistor M11 of the third switch device s3 is kept OFF (transistor M10 keeps node n13 connected to node ns1). When node n11 moves high enough, inverter INV2 detects this condition and moves node n14 down which causes an upward of node n12. Node n13 starts to follow node n12 as soon as the node n12 voltage exceeds the threshold voltage Vt of the third PMOS transistor M13 of the second switch device s2. This leads to the enabling of transistor M11, which provides a path for the first flying capacitor C_fly_1 to recharge via inverter INV1 and transistor M11. The process returns to the initial position and the is ready to be repeated.

Figure 5:
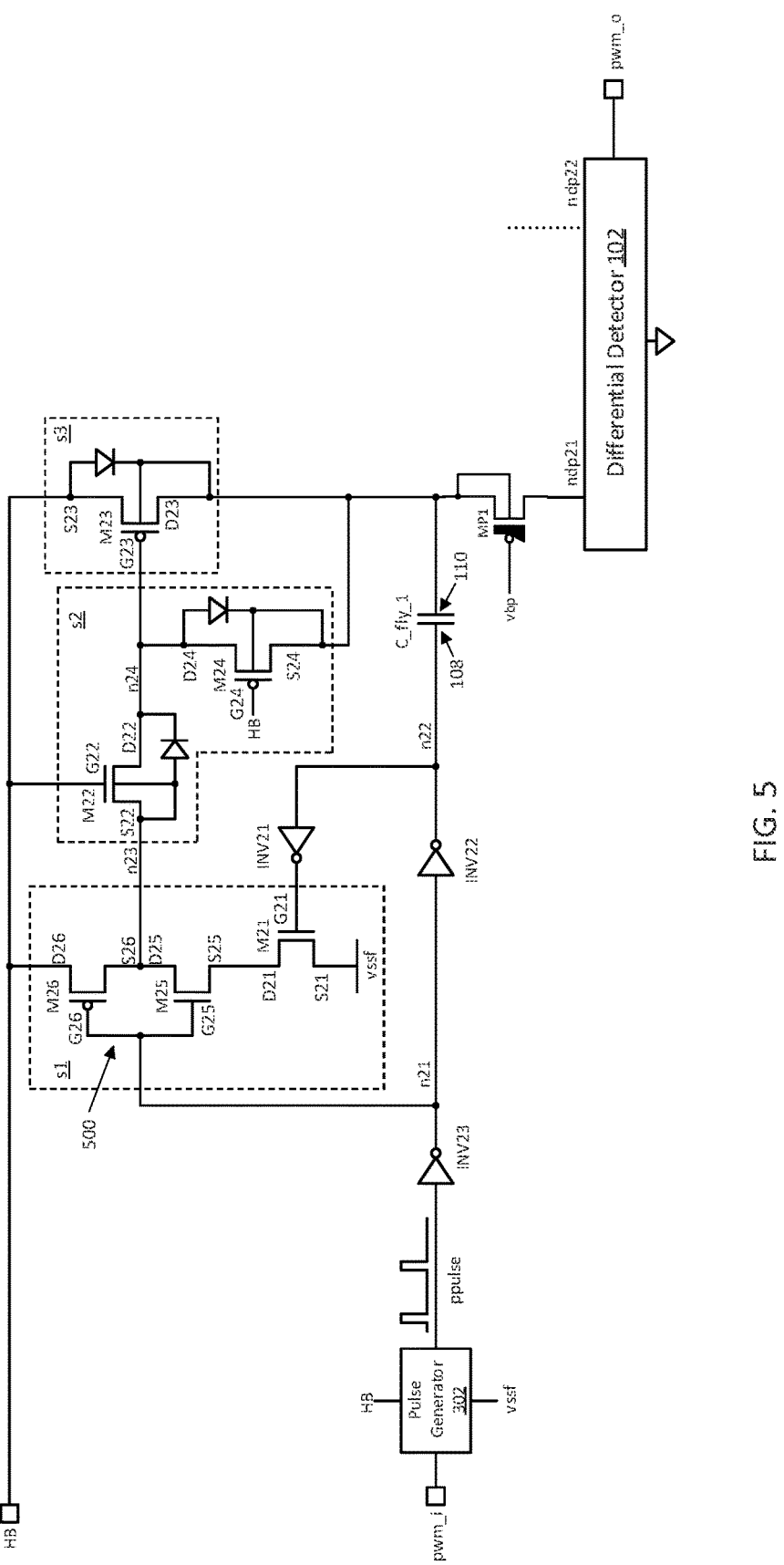
FIG. 5 illustrates a circuit schematic of a first switch network included in the level-down shifter, according to an embodiment.

FIG. 5 illustrates the same circuit as FIG. 3, but implemented as a level-down level shifter 200. In FIG. 5, the pulse generator 302 generates a positive pulse output 'ppulse' based on the digital signal pwm_i input to the level shifter 100. Also, the first switch device s1 of the first switch network s1-s3 includes a first NMOS transistor M21 having a negative pulse gate input G21 via inverter INV21 electrically connected to the first terminal 108 of the first flying capacitor C_fly_1, a source S21 electrically connected to the first ground reference vssf, and a drain D21. The first switch device s1 also includes a first inverter 500 formed by a second NMOS transistor M25 and a first PMOS transistor M26. The first inverter 500 has a negative pulse input via inverter INV23 which is applied to the gate G25 of the second NMOS transistor M25 and to the gate G25 of the first PMOS transistor M26. The source S25 of the second NMOS transistor M25 is electrically coupled to the drain D21 of the first NMOS transistor M21. The drain D26 of the first PMOS transistor M26 is electrically connected to the bootstrap node HB.

The second switch device s2 in FIG. 5 includes a second PMOS transistor M24 having a gate G24 electrically connected to the bootstrap node HB, a source S24 electrically connected to the second terminal 110 of the first flying capacitor C_fly_1, and a drain D24. The second switch device s2 in FIG. 5 also includes a third NMOS transistor M22 having a gate G22 electrically connected to the bootstrap node HB, a source S22 electrically connected to the output of the first inverter 500, and a drain D22 electrically connected to the drain D24 of the second PMOS transistor M24.

The third switch device s3 in FIG. 5 includes a third PMOS transistor M23 having a gate G23 electrically connected to the drain D22 of the third NMOS transistor M22 and the drain D24 of the second PMOS transistor M24, a source S23 electrically connected to the second terminal 114 of the first flying capacitor C_fly_1, and a drain electrically connected to the bootstrap node HB.

The second switch network s4-s6 and the first switch network s1-s3 are symmetric for the down-level shifter case, as shown in FIG. 2. Accordingly, details of the second switch network s4-s6 are not shown in FIG. 5. Similar to the first switch device s1, the fourth switch device s4 includes a fourth NMOS transistor having a negative pulse gate input electrically connected to the first terminal 112 of the second flying capacitor C_fly_2, a source electrically connected to the second ground reference vssf, and a drain. The fourth switch device s4 also includes a second inverter formed by a fifth NMOS transistor and a fourth PMOS transistor, the second inverter having a negative pulse input, a source of the fifth NMOS transistor being electrically coupled to the drain of the fourth NMOS transistor, a drain of the fourth PMOS transistor being electrically connected to the bootstrap node HB. Similar to the second switch device s2, the fifth switch device s5 includes a fifth PMOS transistor having a gate electrically connected to the bootstrap node HB, a source electrically connected to the second terminal 114 of the second flying capacitor C_fly_2, and a drain. The fifth switch device s5 also includes a sixth NMOS transistor having a gate electrically connected to the bootstrap node HB, a source electrically connected to the output of the second inverter, and a drain electrically connected to the drain of the fifth PMOS transistor. Similar to the third switch device s3, the sixth switch device s6 includes a sixth PMOS transistor having a gate electrically connected to the drain of the sixth NMOS transistor and the drain of the fifth PMOS transistor, a source electrically connected to the second terminal 114 of the second flying capacitor C_fly_2, and a drain electrically connected to the bootstrap node HB.

Figure 6:
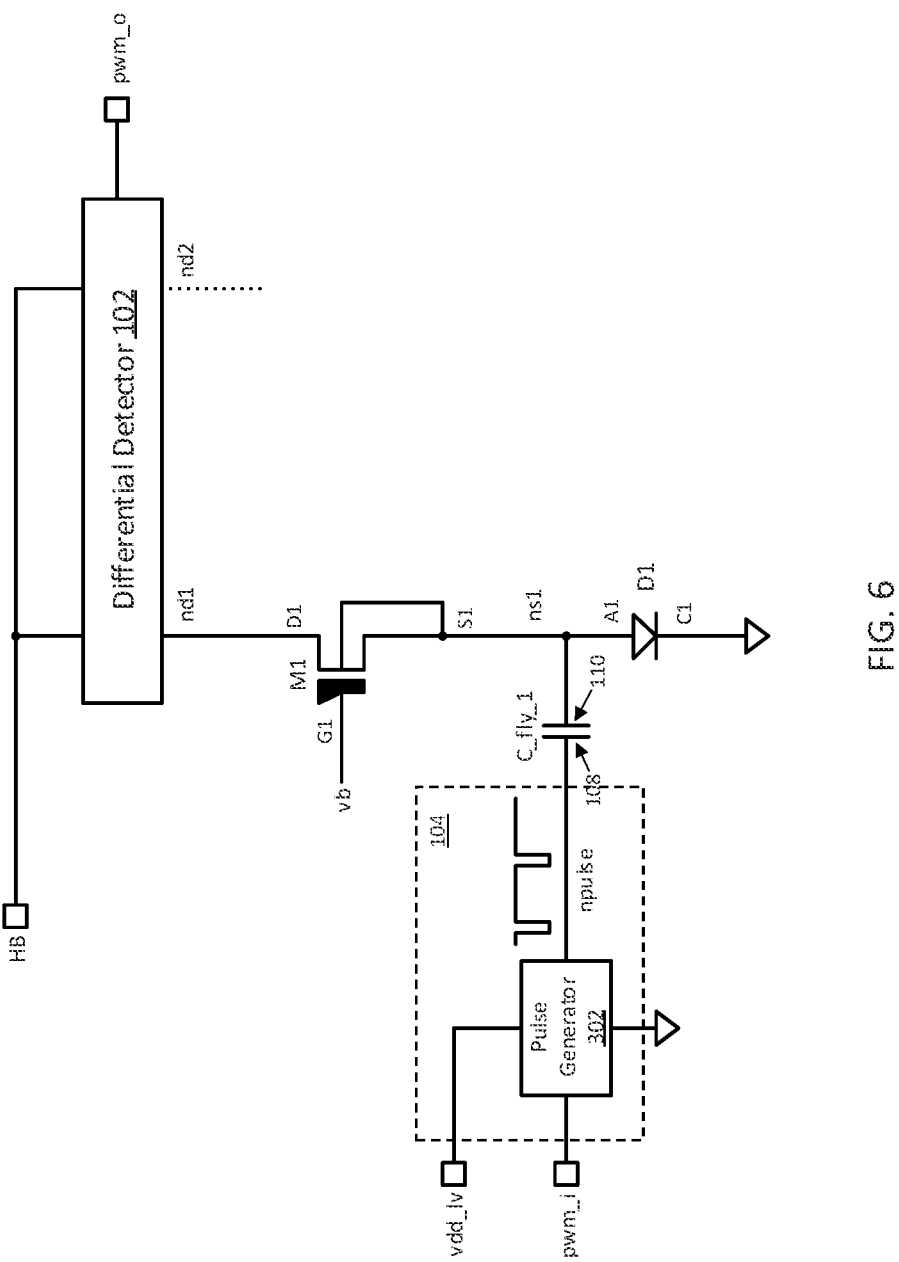
FIG. 6 illustrates a diode-based embodiment of the level-up shifter, according to an embodiment.

FIG. 6 illustrates a diode-based embodiment of the level-up shifter 100. In FIG. 6, the first circuit 104 of the level-up shifter 100 includes a first diode D1 having an anode A1 electrically connected to the source S1 of the first transistor M1 and a cathode C1 electrically connected to ground. The negative pulse signal npulse derived from the digital signal pwm_i input to the level-up shifter 100 is applied to the first terminal 108 of the first flying capacitor C_fly_1. The second terminal 110 of the first flying capacitor C_fly_1 is electrically connected to the source S1 of the first transistor M1 and the anode A1 of the first diode D1.

The first and second level shifter circuits 104, 106 are symmetric for the up-level shifter case, as shown in FIG. 1. Accordingly, details of the second level shifter circuit 106 are not shown in FIG. 6. Similar to the first level shifter circuit 104, the second level shifter circuit 106 includes a second diode having an anode electrically connected to the source S2 of the second transistor M2 and a cathode electrically connected to ground. The negative pulse signal npulse derived from the digital signal pwm_i input to the level-up shifter 100 is applied the first terminal 112 of the second flying capacitor C_fly_2. The second terminal 114 of the second flying capacitor C_fly_2 is electrically connected to the source S2 of the second transistor M2 and the anode of the second diode. In FIG. 6, the gate G1 of the first transistor M1 and the gate G2 of the second transistor M2 are both electrically connected to a fixed DC voltage vb that is less than a diode voltage. Switch devices s1 and s2 are the pulse generator 302 output PMOS and NMOS, respectively. Switch device s3 corresponds to first diode D1.

In FIG. 6, the node ns1 is connected only to the first diode D1 and the first flying capacitor C_fly_1 below the first transistor M1. When the pulse generator 302 applies vdd_lv to the first terminal 108 of the first flying capacitor C_fly_1, the first flying capacitor C_fly_1 is charged with a difference between vdd_lv to ground minus the voltage drop Vf across the first diode D1. The voltage drop Vf across the first diode D1 is typically about 0.7V, depending on the type of semiconductor technology used to implement the first diode D1. In this case, considering the fixed DC voltage vb is a voltage lower than one diode voltage, the VGS of the first transistor M1 is equal or lower than 0V, so M1 is off. When the pulse generator 302 applies ground to the first terminal 108 of the first flying capacitor C_fly_1, node ns1 is forced to a negative voltage which creates VGS and VDS for the first transistor M1, causing current to flow at the first node nd1 of the differential detector 102.

Figure 7:
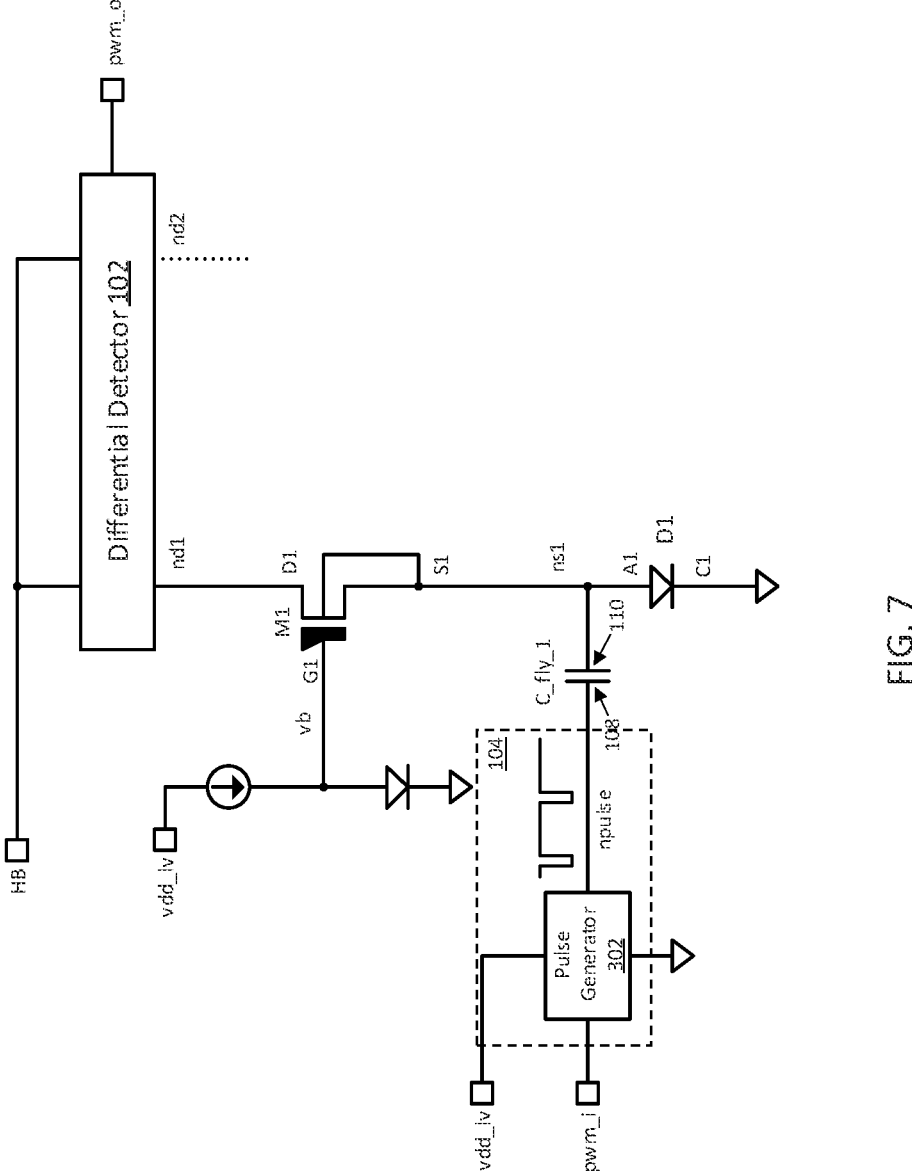
FIG. 7 illustrates a diode-based embodiment of the level-up shifter, according to another embodiment.

FIG. 7 illustrates another diode-based embodiment of the level-up shifter 100. In FIG. 7, the gate G1 of the first transistor M1 and the gate G2 of the second transistor M2 are both biased with a diode voltage Vf at node vb in FIG. 7. In FIG. 6, the first transistor M1 has a VGS of (vdd_Is−ns1) when ON, where ns1 is typically around 0.7V. In FIG. 7, the fixed DC voltage vb is biased with a diode voltage. Accordingly, when the first transistor M1 is on, the VGS of the first transistor M1 is the difference between the gate voltage (vb) and the source voltage (−vdd_lv+ns1). If ns1 and vb are equal, the VGS applied to the first transistor M1 is exactly the voltage vdd_Is which yields better performance compared to the simpler implementation illustrated in FIG. 6 but does require active control.

Figure 8:
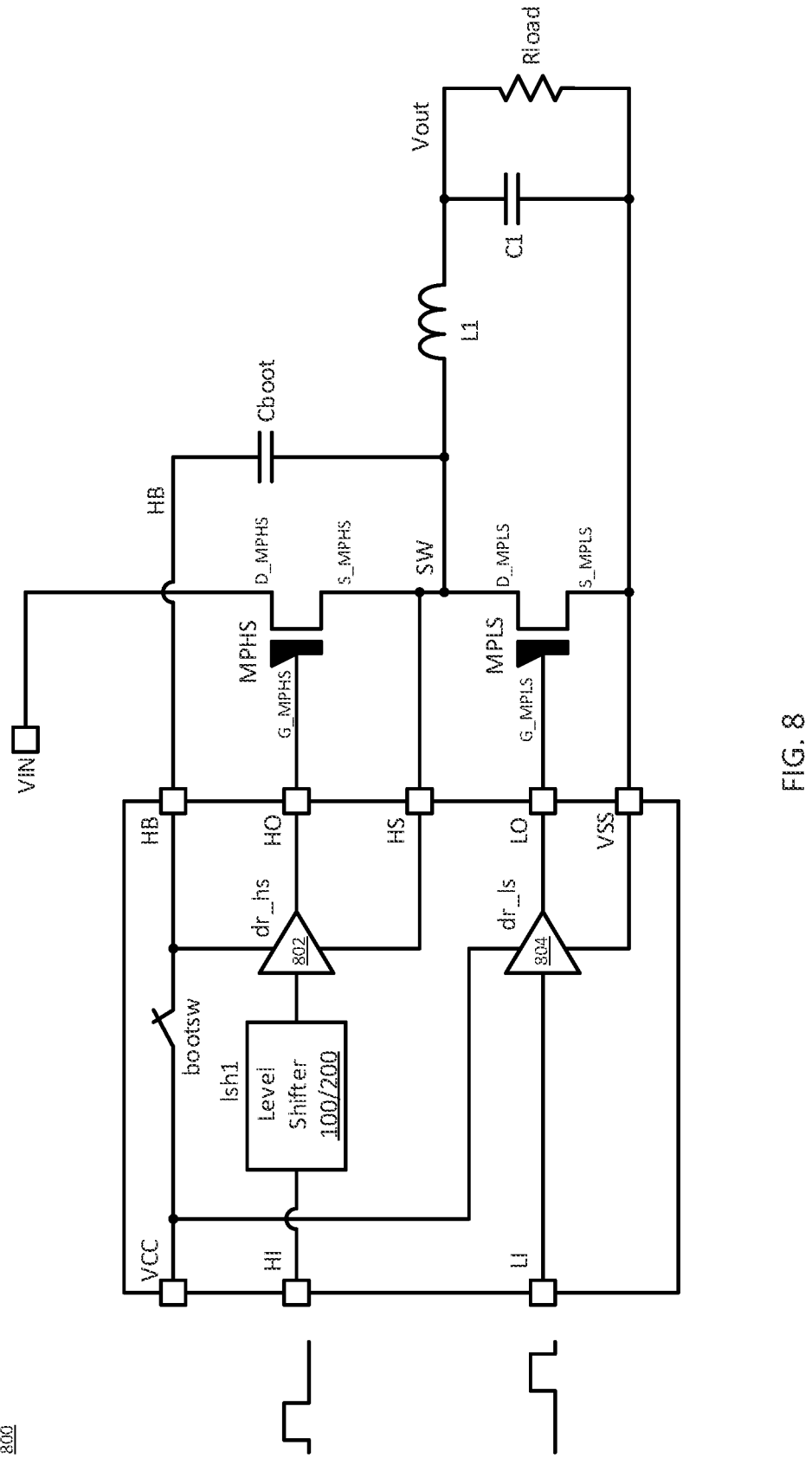
FIG. 8 illustrates an embodiment of a power converter that includes the level-up or level-down shifter described herein.

FIG. 8 illustrates an embodiment of a power converter 800 such as a half bridge converter, a full bridge converter, etc. that includes the level shifter 100 described herein. The power converter 800 also includes a high-side power switch device MPHS and a (floating) gate driver 802 for driving a gate G_MPHS of the high-side power switch device MPHS. The level shifter 100 translates a digital signal HI input to the level shifter 100 to a voltage domain dr_hs of the high-side gate driver 802.

As explained herein, the level shifter 100 includes: a differential detector 102; a first transistor M1 having a drain D1 electrically connected to a first node nd1/ndp1 of the differential detector 102, a gate G1 electrically connected to ground or a fixed DC voltage vb/vbp, and a source; a second transistor M2 having a drain D2 electrically connected to a second node nd2/ndp2 of the differential detector 102, a gate G2 electrically connected to ground or a fixed DC voltage vb/vbp, and a source; a first circuit 104 for dynamically controlling a voltage applied to the source S1 of the first transistor M1 based on the digital input signal HI; and a second circuit 106 for dynamically controlling a voltage applied to the source S2 of the second transistor M2 based on the digital input signal HI. The fixed DC voltage vb/vbp may be the same or different for the first and second transistors M1, M2. The differential detector 102 of the level shifter 100 translates the digital input signal HI to the voltage domain dr_hs of the high-side gate driver 802 based on a differential current between the first transistor M1 and the second transistor M2.

In FIG. 8, the power converter 800 has a buck converter topology. However, the power converter 800 may have a different type of power converter topology such as boost, buck-boost, etc. In the case of a buck converter, the power converter 800 also includes a low-side power switch device MPLS electrically connected to the high-side power switch device MPHS in a half bridge configuration. More particularly, the drain D_MPLS of the low-side power switch device MPLS is electrically connected to the source S_MPHS of the high-side power switch device MPHS, with the source S_MPLS of the low-side power switch device MPLS being electrically connected to a reference potential VSS such as ground and the drain S_MPHS of the high-side power switch device MPHS being electrically connected to a voltage source VIN. A gate driver 804 is provided for driving the gate G_MPLS of the low-side power switch device MPLS. In one embodiment, the drivers 802, 804 are GaN (gallium nitride) drivers.

An inductor L1 is electrically connected to the switch node SW between the low-side power switch device MPLS and the high-side power switch device MPHS. A bootstrap capacitor Cboot is electrically connected between the switch node SW a bootstrap node HB that provides a supply voltage to the gate driver 802 for the high-side power switch device MPHS. The load powered by the power converter 800 is illustrated as a resistor Rload in FIG. 8, with a capacitor C1 that stabilizes the voltage Vout applied to the load Rload. A switch device 'bootsw' recharges the bootstrap capacitor Cboot via a voltage source VCC for the high side gate driver 802.

In the up-level shifter case, the differential detector 102 is coupled between the bootstrap node HB and the first and the second transistors M1, M2 of the up level shifter 100, the first and the second transistors M1, M2 of the up level shifter 100 are coupled between the differential detector 102 and ground, and the differential detector 102 translates the digital input signal HI to a higher voltage level based on the differential current between the first transistor M1 and the second transistor M2 of the up level shifter 100.

In the down-level shifter case, the differential detector 102 is coupled between ground and the first and the second transistors M1, M2 of the down level shifter 200, the first and the second transistors M1, M2 of the down level shifter 200 are coupled between the differential detector 102 and the bootstrap node HB, and the differential detector 102 translates the digital input signal HI to a lower voltage level based on the differential current between the first transistor M1 and the second transistor M2 of the down level shifter 200.

As shown in FIG. 1, the first circuit 104 of the level shifter 100 may include a first flying capacitor C_fly_1 and a first switch network s1-s3 and the second circuit 106 of the level shifter 100 may include a second flying capacitor C_fly_2 and a second switch network s4-s6. In response to a first transition in the digital input signal HI for the high-side gate driver 802, the first switch network s1-s3 connects the first flying capacitor C_fly_1 to the source S1 of the first transistor M1 such that a negative voltage is applied to the source S1 of the first transistor M1. After the first transition in the digital input signal HI for the high-side gate driver 802, the first switch network s1-s3 pre-charges the first flying capacitor C_fly_1 for a next first transition in the digital input signal HI.

In response to a second transition in the digital input signal HI for the high-side gate driver 802 opposite the first transition, the second switch network s4-s6 connects the second flying capacitor C_fly_2 to the source S2 of the second transistor M2 such that a negative voltage is applied to the source S2 of the second transistor M2. After the second transition in the digital input signal HI for the high-side gate driver 802, the second switch network s4-s6 pre-charges the second flying capacitor C_fly_2 for a next second transition in the digital input signal HI. This allows the differential detector 102 to translate the digital input signal HI for the high-side gate driver 802 to a different voltage level (pwm_o) based on the differential current between the first transistor M1 and the second transistor M2. Level the level shifter 200 can be used in case of control on high side and level shifting from the VIN domain to the low side. That is, the level shifter 200 can be connected to the input of the low-side gate driver 804.

Although the present disclosure is not so limited, the following numbered examples demonstrate one or more aspects of the disclosure.

Example 1. A level shifter, comprising: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first circuit configured to dynamically control a voltage applied to the source of the first transistor based on a digital signal input to the level shifter; and a second circuit configured to dynamically control a voltage applied to the source of the second transistor based on the digital signal, wherein the differential detector is configured to translate the digital signal to a different voltage level based on a differential current between the first transistor and the second transistor.

Example 2. The level shifter of example 1, wherein the first circuit comprises a first capacitor and a first switch network, wherein the second circuit comprises a second capacitor and a second switch network, wherein in response to a first transition in the digital signal, the first switch network is configured to connect the first capacitor to the source of the first transistor such that a negative voltage is applied to the source of the first transistor, wherein after the first transition in the digital signal, the first switch network is configured to pre-charge the first capacitor for a next first transition in the digital signal, wherein in response to a second transition in the digital signal opposite the first transition, the second switch network is configured to connect the second capacitor to the source of the second transistor such that a negative voltage is applied to the source of the second transistor, wherein after the second transition in the digital signal, the second switch network is configured to pre-charge the second capacitor for a next second transition in the digital signal.

Example 3. The level shifter of example 2, wherein the first switch network comprises: a first switch device electrically connected between a first DC supply voltage or ground reference and a first terminal of the first capacitor, a second switch device electrically connected between the first terminal of the first capacitor and ground or a bootstrap node, and a third switch device electrically connected between a second terminal of the first capacitor and ground or the bootstrap node, wherein the second terminal of the first capacitor is electrically connected to the source of the first transistor, wherein the second switch network comprises: a fourth switch device electrically connected between a second DC supply voltage or ground reference and a first terminal of the second capacitor, a fifth switch device electrically connected between the first terminal of the second capacitor and ground or the bootstrap node, and a sixth switch device electrically connected between a second terminal of the second capacitor and ground or the bootstrap node, wherein the second terminal of the second capacitor is electrically connected to the source of the second transistor.

Example 4. The level shifter of example 3, wherein the second switch device is configured to turn on in response to the first transition in the digital signal, and the first switch device and the third switch device are both configured to be off when the second switch device is on, wherein the second switch device is configured to turn off after a predefined time from the first transition in the digital signal, and the first switch device and the third switch device are both configured to be on when the second switch device is off, wherein the fifth switch device is configured to turn on in response to the second transition in the digital signal, and the fourth switch device and the sixth switch device are both configured to be off when the fifth switch device is on, wherein the fifth switch device is configured to turn off after a predefined time from the second transition in the digital signal, and the fourth switch device and the sixth switch device are both configured to be on when the fifth switch device is off.

Example 5. The level shifter of any of examples 1 through 4, wherein the differential detector is coupled between a bootstrap node and the first and the second transistors, wherein the first and the second transistors are coupled between the differential detector and ground, and wherein the differential detector is configured to translate the digital signal to a higher voltage level based on the differential current between the first transistor and the second transistor.

Example 6. The level shifter of any of examples 1 through 4, wherein the differential detector is coupled between ground and the first and the second transistors, wherein the first and the second transistors are coupled between the differential detector and a bootstrap node, and wherein the differential detector is configured to translate the digital signal to a lower voltage level based on the differential current between the first transistor and the second transistor.

Example 7. The level shifter of any of examples 1 through 6, wherein the first circuit comprises a first diode having an anode electrically connected to the source of the first transistor and a cathode electrically connected to ground, and a first capacitor having a first terminal to which a pulse signal derived from the digital signal is applied and a second terminal electrically connected to the source of the first transistor and the anode of the first diode, wherein the second circuit comprises a second diode having an anode electrically connected to the source of the second transistor and a cathode electrically connected to ground, and a second capacitor having a first terminal to which a shifted version of the pulse signal is applied and a second terminal electrically connected to the source of the second transistor and the anode of the second diode.

Example 8. The level shifter of example 7, wherein the gate of the first transistor is electrically connected to a fixed DC voltage that is less than a diode voltage, and wherein the gate of the second transistor is electrically connected to a fixed DC voltage that is less than a diode voltage.

Example 9. The level shifter of example 7, wherein the gate of the first transistor is biased with a diode voltage, and wherein the gate of the second transistor is biased with a diode voltage.

Example 10. A level shifter, comprising: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first capacitor having a first terminal and second terminal, the second terminal being electrically connected to the source of the first transistor; a first switch device electrically connected between a first DC supply voltage or ground reference and the first terminal of the first capacitor; a second switch device electrically connected between the first terminal of the first capacitor and ground or a bootstrap node; a third switch device electrically connected between the second terminal of the first capacitor and ground or the bootstrap node; a second capacitor having a first terminal and second terminal, the second terminal being electrically connected to the source of the second transistor; a fourth switch device electrically connected between a second DC supply voltage or ground reference and the first terminal of the second capacitor; a fifth switch device electrically connected between the first terminal of the second capacitor and ground or the bootstrap node; and a sixth switch device electrically connected between the second terminal of the second capacitor and ground or the bootstrap node.

Example 11. The level shifter of example 10, wherein the first switch device comprises: a first PMOS transistor having a positive pulse gate input electrically connected to the first terminal of the first capacitor, a drain electrically connected to the first DC supply voltage, and a source; and a first inverter formed by a second PMOS transistor and a first NMOS transistor, the first inverter having a positive pulse input, a drain of the second PMOS transistor being electrically coupled to the source of the first PMOS transistor, a source of the first NMOS transistor being grounded, wherein the second switch device comprises: a second NMOS transistor having a grounded gate input, a source electrically connected to the source of the first transistor and the second terminal of the first capacitor, and a drain; and a third PMOS transistor having a grounded gate input, a source electrically connected to an output of the first inverter, and a drain electrically connected to the drain of the second NMOS transistor, wherein the third switch device comprises: a third NMOS transistor having a gate electrically connected to the drain of the third PMOS transistor and the drain of the second NMOS transistor, a source electrically connected to the source of the first transistor, and a drain electrically connected to ground.

Example 12. The level shifter of example 11, wherein the fourth switch device comprises: a fourth PMOS transistor having a positive pulse gate input electrically connected to the first terminal of the second capacitor, a drain electrically connected to the second DC supply voltage, and a source; and a second inverter formed by a fifth PMOS transistor and a fourth NMOS transistor, the second inverter having a positive pulse input, a drain of the fifth PMOS transistor being electrically coupled to the source of the second PMOS transistor, a source of the fourth NMOS transistor being grounded, wherein the fifth switch device comprises: a fifth NMOS transistor having a grounded gate input, a source electrically connected to the source of the second transistor and the second terminal of the second capacitor, and a drain; and a sixth PMOS transistor having a grounded gate input, a source electrically connected to an output of the second inverter, and a drain electrically connected to the drain of the fifth NMOS transistor, wherein the sixth switch device comprises: a sixth NMOS transistor having a gate electrically connected to the drain of the sixth PMOS transistor and the drain of the fifth NMOS transistor, a source electrically connected to the source of the second transistor, and a drain electrically connected to ground.

Example 13. The level shifter of example 10, wherein the first switch device comprises: a first NMOS transistor having a negative pulse gate input electrically connected to the first terminal of the first capacitor, a source electrically connected to the first ground reference, and a drain; and a first inverter formed by a second NMOS transistor and a first PMOS transistor, the first inverter having a negative pulse input, a source of the second NMOS transistor being electrically coupled to the drain of the first NMOS transistor, a drain of the first PMOS transistor being electrically connected to a bootstrap node, wherein the second switch device comprises: a second PMOS transistor having a gate electrically connected to the bootstrap node, a source electrically connected to the second terminal of the first capacitor, and a drain; and a third NMOS transistor having a gate electrically connected to the bootstrap node, a source electrically connected to an output of the first inverter, and a drain electrically connected to the drain of the second PMOS transistor, wherein the third switch device comprises: a third PMOS transistor having a gate electrically connected to the drain of the third NMOS transistor and the drain of the second PMOS transistor, a source electrically connected to the second terminal of the first capacitor, and a drain electrically connected to the bootstrap node.

Example 14. The level shifter of example 13, wherein the fourth switch device comprises: a fourth NMOS transistor having a negative pulse gate input electrically connected to the first terminal of the second capacitor, a source electrically connected to the second ground reference, and a drain; and a second inverter formed by a fifth NMOS transistor and a fourth PMOS transistor, the second inverter having a negative pulse input, a source of the fifth NMOS transistor being electrically coupled to the drain of the fourth NMOS transistor, a drain of the fourth PMOS transistor being electrically connected to the bootstrap node, wherein the fifth switch device comprises: a fifth PMOS transistor having a gate electrically connected to the bootstrap node, a source electrically connected to the second terminal of the second capacitor, and a drain; and a sixth NMOS transistor having a gate electrically connected to the bootstrap node, a source electrically connected to an output of the second inverter, and a drain electrically connected to the drain of the fifth PMOS transistor, wherein the sixth switch device comprises: a sixth PMOS transistor having a gate electrically connected to the drain of the sixth NMOS transistor and the drain of the fifth PMOS transistor, a source electrically connected to the second terminal of the second capacitor, and a drain electrically connected to the bootstrap node.

Example 15. A power converter, comprising: a high-side power switch device; a gate driver configured to drive a gate of the high-side power switch device; and a level shifter configured to translate a digital signal input to the level shifter to a voltage domain of the gate driver, wherein the level shifter comprises: a differential detector; a first transistor having a drain electrically connected to a first node of the differential detector, a gate electrically connected to ground or a fixed DC voltage, and a source; a second transistor having a drain electrically connected to a second node of the differential detector, a gate electrically connected to ground or a same or different fixed DC voltage as the first transistor, and a source; a first circuit configured to dynamically control a voltage applied to the source of the first transistor based on the digital signal; and a second circuit configured to dynamically control a voltage applied to the source of the second transistor based on the digital signal, wherein the differential detector is configured to translate the digital signal to the voltage domain of the gate driver based on a differential current between the first transistor and the second transistor.

Example 16. The power converter of example 15, further comprising: a low-side power switch device electrically connected to the high-side power switch device in a half bridge configuration; an inductor electrically connected to a switch node between the low-side power switch device and the high-side power switch device; and a capacitor electrically connected between the switch node and a bootstrap node that provides a supply voltage to the gate driver for the high-side power switch device.

Example 17. The power converter of example 16, wherein the differential detector is coupled between the bootstrap node and the first and the second transistors of the level shifter, wherein the first and the second transistors of the level shifter are coupled between the differential detector and ground, and wherein the differential detector is configured to translate the digital signal to a higher voltage level based on the differential current between the first transistor and the second transistor of the level shifter.

Example 18. The power converter of example 16, wherein the differential detector is coupled between ground and the first and the second transistors of the level shifter, wherein the first and the second transistors of the level shifter are coupled between the differential detector and the bootstrap node, and wherein the differential detector is configured to translate the digital signal to a lower voltage level based on the differential current between the first transistor and the second transistor of the level shifter.

Example 19. The power converter of any of examples 15 through 18, wherein the first circuit of the level shifter comprises a first capacitor and a first switch network, wherein the second circuit of the level shifter comprises a second capacitor and a second switch network, wherein in response to a first transition in the digital signal, the first switch network is configured to connect the first capacitor to the source of the first transistor such that a negative voltage is applied to the source of the first transistor, wherein after the first transition in the digital signal, the first switch network is configured to pre-charge the first capacitor for a next first transition in the digital signal, wherein in response to a second transition in the digital signal opposite the first transition, the second switch network is configured to connect the second capacitor to the source of the second transistor such that a negative voltage is applied to the source of the second transistor, wherein after the second transition in the digital signal, the second switch network is configured to pre-charge the second capacitor for a next second transition in the digital signal.

Example 20. The of the power converter of example 19, wherein the first switch network of the level shifter comprises: a first switch device electrically connected between a first DC supply voltage or ground reference and a first terminal of the first capacitor, a second switch device electrically connected between the first terminal of the first capacitor and ground, and a third switch device electrically connected between a second terminal of the first capacitor and ground, wherein the second terminal of the first capacitor is electrically connected to the source of the first transistor, wherein the second switch network of the level shifter comprises: a fourth switch device electrically connected between a second DC supply voltage or ground reference and a first terminal of the second capacitor, a fifth switch device electrically connected between the first terminal of the second capacitor and ground, and a sixth switch device electrically connected between a second terminal of the second capacitor and ground, wherein the second terminal of the second capacitor is electrically connected to the source of the second transistor.

Example 21. The power converter of any of examples 15 through 20, wherein the first circuit of the level shifter comprises a first diode having an anode electrically connected to the source of the first transistor and a cathode electrically connected to ground, and a first capacitor having a first terminal to which a pulse signal derived from the digital signal is applied and a second terminal electrically connected to the source of the first transistor and the anode of the first diode, wherein the second circuit of the level shifter comprises a second diode having an anode electrically connected to the source of the second transistor and a cathode electrically connected to ground, and a second capacitor having a first terminal to which a shifted version of the pulse signal is applied and a second terminal electrically connected to the source of the second transistor and the anode of the second diode.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A level shifter, comprising:
a differential detector;
a first transistor having a drain electrically connected to a first node of the differential detector, a gate that is grounded or electrically connected to a fixed DC voltage, and a source;
a second transistor having a drain electrically connected to a second node of the differential detector, a gate that is grounded or electrically connected to a same or different fixed DC voltage as the first transistor, and a source;
a first circuit configured to dynamically control a voltage applied to the source of the first transistor based on a digital signal input to the level shifter; and
a second circuit configured to dynamically control a voltage applied to the source of the second transistor based on the digital signal, wherein the differential detector is configured to translate the digital signal to a different voltage level based on a differential current between the first transistor and the second transistor,
wherein the first circuit comprises a first capacitor and a first switch network,
wherein the second circuit comprises a second capacitor and a second switch network,
wherein in response to a first transition in the digital signal, the first switch network is configured to connect the first capacitor to the source of the first transistor such that a negative voltage is applied to the source of the first transistor,
wherein after the first transition in the digital signal, the first switch network is configured to pre-charge the first capacitor for a next first transition in the digital signal,
wherein in response to a second transition in the digital signal opposite the first transition, the second switch network is configured to connect the second capacitor to the source of the second transistor such that a negative voltage is applied to the source of the second transistor,
wherein after the second transition in the digital signal, the second switch network is configured to pre-charge the second capacitor for a next second transition in the digital signal.

2. The level shifter of claim 1,
wherein the first switch network comprises:
a first switch device electrically connected between a first DC supply voltage or a first ground reference and a first terminal of the first capacitor, a second switch device electrically connected between the first terminal of the first capacitor and the first ground reference or a bootstrap node, and a third switch device electrically connected between a second terminal of the first capacitor and the first ground reference or the bootstrap node,
wherein the second terminal of the first capacitor is electrically connected to the source of the first transistor,
wherein the second switch network comprises:
a fourth switch device electrically connected between a second DC supply voltage or a second ground reference and a first terminal of the second capacitor, a fifth switch device electrically connected between the first terminal of the second capacitor and the second ground reference or the bootstrap node, and a sixth switch device electrically connected between a second terminal of the second capacitor and the second ground reference or the bootstrap node,
wherein the second terminal of the second capacitor is electrically connected to the source of the second transistor.

3. The level shifter of claim 2,
wherein the second switch device is configured to turn on in response to the first transition in the digital signal, and the first switch device and the third switch device are both configured to be off when the second switch device is on,
wherein the second switch device is configured to turn off after a predefined time from the first transition in the digital signal, and the first switch device and the third switch device are both configured to be on when the second switch device is off,
wherein the fifth switch device is configured to turn on in response to the second transition in the digital signal, and the fourth switch device and the sixth switch device are both configured to be off when the fifth switch device is on, wherein the fifth switch device is configured to turn off after a predefined time from the second transition in the digital signal, and the fourth switch device and the sixth switch device are both configured to be on when the fifth switch device is off.

4. The level shifter of claim 1, wherein the differential detector is coupled between a bootstrap node and the first and the second transistors, wherein the first and the second transistors are coupled between the differential detector and a ground reference, and wherein the differential detector is configured to translate the digital signal to a higher voltage level based on the differential current between the first transistor and the second transistor.

5. The level shifter of claim 1, wherein the differential detector is coupled between a ground reference and the first and the second transistors, wherein the first and the second transistors are coupled between the differential detector and a bootstrap node, and wherein the differential detector is configured to translate the digital signal to a lower voltage level based on the differential current between the first transistor and the second transistor.

6. A level shifter, comprising:
a differential detector;
a first transistor having a drain electrically connected to a first node of the differential detector, a gate that is grounded or electrically connected to a fixed DC voltage, and a source;
a second transistor having a drain electrically connected to a second node of the differential detector, a gate that is grounded or electrically connected to a same or different fixed DC voltage as the first transistor, and a source;
a first capacitor having a first terminal and second terminal, the second terminal being electrically connected to the source of the first transistor;
a first switch device electrically connected between a first DC supply voltage or a first ground reference and the first terminal of the first capacitor;
a second switch device electrically connected between the first terminal of the first capacitor and the first ground reference or a bootstrap node;
a third switch device electrically connected between the second terminal of the first capacitor and the first ground reference or the bootstrap node;
a second capacitor having a first terminal and second terminal, the second terminal being electrically connected to the source of the second transistor;
a fourth switch device electrically connected between a second DC supply voltage or a second ground reference and the first terminal of the second capacitor;
a fifth switch device electrically connected between the first terminal of the second capacitor and the second ground reference or the bootstrap node; and
a sixth switch device electrically connected between the second terminal of the second capacitor and the second ground reference or the bootstrap node.

7. The level shifter of claim 6,
wherein the first switch device comprises:
a first PMOS transistor having a positive pulse gate input electrically connected to the first terminal of the first capacitor, a drain electrically connected to the first DC supply voltage, and a source; and
a first inverter formed by a second PMOS transistor and a first NMOS transistor, the first inverter having a positive pulse input, a drain of the second PMOS transistor being electrically coupled to the source of the first PMOS transistor, a source of the first NMOS transistor being grounded, wherein the second switch device comprises:
a second NMOS transistor having a grounded gate input, a source electrically connected to the source of the first transistor and the second terminal of the first capacitor, and a drain; and
a third PMOS transistor having a grounded gate input, a source electrically connected to an output of the first inverter, and a drain electrically connected to the drain of the second NMOS transistor, wherein the third switch device comprises:
a third NMOS transistor having a gate electrically connected to the drain of the third PMOS transistor and the drain of the second NMOS transistor, a source electrically connected to the source of the first transistor, and a grounded drain.

8. The level shifter of claim 7,
wherein the fourth switch device comprises:
a fourth PMOS transistor having a positive pulse gate input electrically connected to the first terminal of the second capacitor, a drain electrically connected to the second DC supply voltage, and a source; and
a second inverter formed by a fifth PMOS transistor and a fourth NMOS transistor, the second inverter having a positive pulse input, a drain of the fifth PMOS transistor being electrically coupled to the source of the second PMOS transistor, a source of the fourth NMOS transistor being grounded, wherein the fifth switch device comprises:
a fifth NMOS transistor having a grounded gate input, a source electrically connected to the source of the second transistor and the second terminal of the second capacitor, and a drain; and
a sixth PMOS transistor having a grounded gate input, a source electrically connected to an output of the second inverter, and a drain electrically connected to the drain of the fifth NMOS transistor, wherein the sixth switch device comprises:
a sixth NMOS transistor having a gate electrically connected to the drain of the sixth PMOS transistor and the drain of the fifth NMOS transistor, a source electrically connected to the source of the second transistor, and a grounded drain.

9. The level shifter of claim 6,
wherein the first switch device comprises:
a first NMOS transistor having a negative pulse gate input electrically connected to the first terminal of the first capacitor, a source electrically connected to the first ground reference, and a drain; and
a first inverter formed by a second NMOS transistor and a first PMOS transistor, the first inverter having a negative pulse input, a source of the second NMOS transistor being electrically coupled to the drain of the first NMOS transistor, a drain of the first PMOS transistor being electrically connected to a bootstrap node, wherein the second switch device comprises:
a second PMOS transistor having a gate electrically connected to the bootstrap node, a source electrically connected to the second terminal of the first capacitor, and a drain; and
a third NMOS transistor having a gate electrically connected to the bootstrap node, a source electrically connected to an output of the first inverter, and a drain electrically connected to the drain of the second PMOS transistor, wherein the third switch device comprises:

a third PMOS transistor having a gate electrically connected to the drain of the third NMOS transistor and the drain of the second PMOS transistor, a source electrically connected to the second terminal of the first capacitor, and a drain electrically connected to the bootstrap node.

10. The level shifter of claim 9, wherein the fourth switch device comprises:

a fourth NMOS transistor having a negative pulse gate input electrically connected to the first terminal of the second capacitor, a source electrically connected to the second ground reference, and a drain; and a second inverter formed by a fifth NMOS transistor and a fourth PMOS transistor, the second inverter having a negative pulse input, a source of the fifth NMOS transistor being electrically coupled to the drain of the fourth NMOS transistor, a drain of the fourth PMOS transistor being electrically connected to the bootstrap node, wherein the fifth switch device comprises:

a fifth PMOS transistor having a gate electrically connected to the bootstrap node, a source electrically connected to the second terminal of the second capacitor, and a drain; and a sixth NMOS transistor having a gate electrically connected to the bootstrap node, a source electrically connected to an output of the second inverter, and a drain electrically connected to the drain of the fifth PMOS transistor, wherein the sixth switch device comprises:

a sixth PMOS transistor having a gate electrically connected to the drain of the sixth NMOS transistor and the drain of the fifth PMOS transistor, a source electrically connected to the second terminal of the second capacitor, and a drain electrically connected to the bootstrap node.

11. A power converter, comprising:

a high-side power switch device;

a gate driver configured to drive a gate of the high-side power switch device; and a level shifter configured to translate a digital signal input to the level shifter to a voltage domain of the gate driver, wherein the level shifter comprises:

a differential detector;

a first transistor having a drain electrically connected to a first node of the differential detector, a gate that is grounded or electrically connected to a fixed DC voltage, and a source;

a second transistor having a drain electrically connected to a second node of the differential detector, a gate that is grounded or electrically connected to a same or different fixed DC voltage as the first transistor, and a source;

a first circuit configured to dynamically control a voltage applied to the source of the first transistor based on the digital signal; and a second circuit configured to dynamically control a voltage applied to the source of the second transistor based on the digital signal, wherein the differential detector is configured to translate the digital signal to the voltage domain of the gate driver based on a differential current between the first transistor and the second transistor, wherein the first circuit of the level shifter comprises a first capacitor and a first switch network, wherein the second circuit of the level shifter comprises a second capacitor and a second switch network, wherein in response to a first transition in the digital signal, the first switch network is configured to connect the first capacitor to the source of the first transistor such that a negative voltage is applied to the source of the first transistor, wherein after the first transition in the digital signal, the first switch network is configured to pre-charge the first capacitor for a next first transition in the digital signal, wherein in response to a second transition in the digital signal opposite the first transition, the second switch network is configured to connect the second capacitor to the source of the second transistor such that a negative voltage is applied to the source of the second transistor, wherein after the second transition in the digital signal, the second switch network is configured to pre-charge the second capacitor for a next second transition in the digital signal.

12. The power converter of claim 11, further comprising:

a low-side power switch device electrically connected to the high-side power switch device in a half bridge configuration;

an inductor electrically connected to a switch node between the low-side power switch device and the high-side power switch device; and a capacitor electrically connected between the switch node and a bootstrap node that provides a supply voltage to the gate driver for the high-side power switch device.

13. The power converter of claim 12, wherein the differential detector is coupled between the bootstrap node and the first and the second transistors of the level shifter, wherein the first and the second transistors of the level shifter are coupled between the differential detector and a ground reference, and wherein the differential detector is configured to translate the digital signal to a higher voltage level based on the differential current between the first transistor and the second transistor of the level shifter.

14. The power converter of claim 12, wherein the differential detector is coupled between a ground reference and the first and the second transistors of the level shifter, wherein the first and the second transistors of the level shifter are coupled between the differential detector and the bootstrap node, and wherein the differential detector is configured to translate the digital signal to a lower voltage level based on the differential current between the first transistor and the second transistor of the level shifter.

15. The power converter of claim 11, wherein the first switch network of the level shifter comprises:

a first switch device electrically connected between a first DC supply voltage or a first ground reference and a first terminal of the first capacitor, a second switch device electrically connected between the first terminal of the first capacitor and ground, and a third switch device electrically connected between a second terminal of the first capacitor and the first ground reference, wherein the second terminal of the first capacitor is electrically connected to the source of the first transistor, wherein the second switch network of the level shifter comprises:

a fourth switch device electrically connected between a second DC supply voltage or a second ground reference and a first terminal of the second capacitor, a fifth switch device electrically connected between the first terminal of the second capacitor and the second ground reference, and a sixth switch device electrically connected between a second terminal of the second capacitor and the second ground reference, wherein the second terminal of the second capacitor is electrically connected to the source of the second transistor.

16. A level shifter, comprising:

a differential detector;

a first transistor having a drain electrically connected to a first node of the differential detector, a gate that is grounded or electrically connected to a fixed DC voltage, and a source;

a second transistor having a drain electrically connected to a second node of the differential detector, a gate that is grounded or electrically connected to a same or different fixed DC voltage as the first transistor, and a source;

a first circuit configured to dynamically control a voltage applied to the source of the first transistor based on a digital signal input to the level shifter; and a second circuit configured to dynamically control a voltage applied to the source of the second transistor based on the digital signal, wherein the differential detector is configured to translate the digital signal to a different voltage level based on a differential current between the first transistor and the second transistor;

wherein the first circuit comprises a first diode having an anode electrically connected to the source of the first transistor and a grounded cathode, and a first capacitor having a first terminal to which a pulse signal derived from the digital signal is applied and a second terminal electrically connected to the source of the first transistor and the anode of the first diode, wherein the second circuit comprises a second diode having an anode electrically connected to the source of the second transistor and a grounded cathode, and a second capacitor having a first terminal to which a shifted version of the pulse signal is applied and a second terminal electrically connected to the source of the second transistor and the anode of the second diode.

17. The level shifter of claim 16, wherein the gate of the first transistor is electrically connected to a fixed DC voltage that is less than a diode voltage, and wherein the gate of the second transistor is electrically connected to a fixed DC voltage that is less than a diode voltage.

18. The level shifter of claim 16, wherein the gate of the first transistor is biased with a diode voltage, and wherein the gate of the second transistor is biased with a diode voltage.

19. A power converter, comprising:

a high-side power switch device;

a gate driver configured to drive a gate of the high-side power switch device; and a level shifter configured to translate a digital signal input to the level shifter to a voltage domain of the gate driver, wherein the level shifter comprises:

a differential detector;

a first transistor having a drain electrically connected to a first node of the differential detector, a gate that is grounded or electrically connected to a fixed DC voltage, and a source;

a second transistor having a drain electrically connected to a second node of the differential detector, a gate that is grounded or electrically connected to a same or different fixed DC voltage as the first transistor, and a source;

a first circuit configured to dynamically control a voltage applied to the source of the first transistor based on the digital signal; and a second circuit configured to dynamically control a voltage applied to the source of the second transistor based on the digital signal, wherein the differential detector is configured to translate the digital signal to the voltage domain of the gate driver based on a differential current between the first transistor and the second transistor, wherein the first circuit of the level shifter comprises a first diode having an anode electrically connected to the source of the first transistor and a grounded cathode, and a first capacitor having a first terminal to which a pulse signal derived from the digital signal is applied and a second terminal electrically connected to the source of the first transistor and the anode of the first diode, wherein the second circuit of the level shifter comprises a second diode having an anode electrically connected to the source of the second transistor and a grounded cathode, and a second capacitor having a first terminal to which a shifted version of the pulse signal is applied and a second terminal electrically connected to the source of the second transistor and the anode of the second diode.

* * * * *